United States Patent
Choi et al.

(10) Patent No.: US 7,977,774 B2
(45) Date of Patent: *Jul. 12, 2011

(54) FUSION QUAD FLAT SEMICONDUCTOR PACKAGE

(75) Inventors: YeonHo Choi, Chandler, AZ (US); GiJeong Kim, Guri-si (KR); WanJong Kim, Goyang-si (KR)

(73) Assignee: Amkor Technology, Inc., Chandler, AZ (US)

( * ) Notice: Subject to any disclaimer, the term of this patent is extended or adjusted under 35 U.S.C. 154(b) by 613 days.

This patent is subject to a terminal disclaimer.

(21) Appl. No.: 11/775,566

(22) Filed: Jul. 10, 2007

(65) Prior Publication Data

US 2009/0014851 A1  Jan. 15, 2009

(51) Int. Cl.
*H01L 23/495* (2006.01)
(52) U.S. Cl. ....... 257/666; 257/669; 257/676; 257/670; 257/672; 257/784; 257/E33.06; 257/E23.031; 257/E23.042; 257/E23.045; 438/123; 438/124
(58) Field of Classification Search .................. 257/666, 257/669, 676, 670, 672, E33.06, E23.031, 257/E23.042, E23.045, E23.048, E23.049, 257/E23.052, E23.066, E23.141, 784, 787; 438/124, 111, 123, 25, 26
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |

(Continued)

FOREIGN PATENT DOCUMENTS

DE   19734794 A1   8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Lynne A Gurley
*Assistant Examiner* — Yosef Gebreyesus
(74) *Attorney, Agent, or Firm* — Stetina Brunda Garred & Brucker

(57) ABSTRACT

A semiconductor package which includes a generally planar die paddle defining multiple peripheral edge segments and a plurality of leads which are segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of at least one row thereof being exposed in a common exterior surface of the package body.

20 Claims, 7 Drawing Sheets

U.S. PATENT DOCUMENTS

| | | |
|---|---|---|
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,197,183 A * | 3/1993 | Chia et al. ................. 29/827 |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,389,739 A * | 2/1995 | Mills ........................ 174/540 |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| 6,143,981 A | 11/2000 | Glenn |
| 6,150,709 A | 11/2000 | Shin et al. |
| 6,157,074 A * | 12/2000 | Lee .............................. 257/666 |
| 6,166,430 A | 12/2000 | Yamaguchi |
| 6,169,329 B1 | 1/2001 | Farnworth et al. |
| 6,177,718 B1 | 1/2001 | Kozono |

| | | | | | | |
|---|---|---|---|---|---|---|
| 6,181,002 B1 | 1/2001 | Juso et al. | 6,507,096 B2 | 1/2003 | Gang | |
| 6,184,465 B1 | 2/2001 | Corisis | 6,507,120 B1 | 1/2003 | Lo et al. | |
| 6,184,573 B1 | 2/2001 | Pu | 6,518,089 B2 | 2/2003 | Coyle | |
| 6,194,777 B1 | 2/2001 | Abbott et al. | 6,534,849 B1 | 3/2003 | Gang | |
| 6,197,615 B1 | 3/2001 | Song et al. | 6,545,332 B2 | 4/2003 | Huang | |
| 6,198,171 B1 | 3/2001 | Huang et al. | 6,545,345 B1 | 4/2003 | Glenn et al. | |
| 6,201,186 B1 | 3/2001 | Daniels et al. | 6,552,421 B2 | 4/2003 | Kishimoto et al. | |
| 6,201,292 B1 | 3/2001 | Yagi et al. | 6,559,525 B2 | 5/2003 | Huang | |
| 6,204,554 B1 | 3/2001 | Ewer et al. | 6,566,168 B2 | 5/2003 | Gang | |
| 6,208,020 B1 | 3/2001 | Minamio et al. | 6,580,161 B2 | 6/2003 | Kobayakawa | |
| 6,208,021 B1 | 3/2001 | Ohuchi et al. | 6,583,503 B2 | 6/2003 | Akram et al. | |
| 6,208,023 B1 | 3/2001 | Nakayama et al. | 6,603,196 B2 | 8/2003 | Lee et al. | |
| 6,211,462 B1 | 4/2001 | Carter, Jr. et al. | 6,624,005 B1 | 9/2003 | DiCaprio et al. | |
| 6,218,731 B1 | 4/2001 | Huang et al. | 6,627,977 B1 | 9/2003 | Foster | |
| 6,222,258 B1 | 4/2001 | Asano et al. | 6,667,546 B2 | 12/2003 | Huang et al. | |
| 6,222,259 B1 | 4/2001 | Park et al. | 6,677,663 B1 | 1/2004 | Ku et al. | |
| 6,225,146 B1 | 5/2001 | Yamaguchi et al. | 6,686,649 B1 | 2/2004 | Mathews et al. | |
| 6,229,200 B1 | 5/2001 | McClellan et al. | 6,696,752 B2 | 2/2004 | Su et al. | |
| 6,229,205 B1 | 5/2001 | Jeong et al. | 6,700,189 B2 | 3/2004 | Shibata | |
| 6,239,367 B1 | 5/2001 | Hsuan et al. | 6,713,375 B2 | 3/2004 | Shenoy | |
| 6,239,384 B1 | 5/2001 | Smith et al. | 6,800,936 B2 | 10/2004 | Kosemura et al. | |
| 6,242,281 B1 | 6/2001 | McClellan et al. | 6,818,973 B1 | 11/2004 | Foster | |
| 6,256,200 B1 | 7/2001 | Lam et al. | 6,858,919 B2 | 2/2005 | Seo et al. | |
| 6,258,629 B1 | 7/2001 | Niones et al. | 6,867,492 B2 | 3/2005 | Auburger et al. | |
| 6,281,566 B1 | 8/2001 | Magni | 6,876,068 B1 | 4/2005 | Lee et al. | |
| 6,281,568 B1 | 8/2001 | Glenn et al. | 6,927,478 B2 | 8/2005 | Paek | |
| 6,282,095 B1 | 8/2001 | Houghton et al. | 6,967,125 B2 | 11/2005 | Fee | |
| 6,285,075 B1 | 9/2001 | Combs et al. | 6,995,459 B2 | 2/2006 | Lee | |
| 6,291,271 B1 | 9/2001 | Lee et al. | 7,005,327 B2 | 2/2006 | Kung et al. | |
| 6,291,273 B1 | 9/2001 | Miyaki et al. | 7,045,396 B2 | 5/2006 | Crowley et al. | |
| 6,294,100 B1 | 9/2001 | Fan et al. | 7,053,469 B2 | 5/2006 | Koh et al. | |
| 6,294,830 B1 | 9/2001 | Fjelstad | 7,102,209 B1 | 9/2006 | Bayan et al. | |
| 6,295,977 B1 | 10/2001 | Ripper et al. | 7,109,572 B2 | 9/2006 | Fee | |
| 6,303,984 B1 | 10/2001 | Corisis | 7,075,816 B2 | 11/2006 | Fee | |
| 6,303,997 B1 | 10/2001 | Lee | 7,193,298 B2 | 3/2007 | Hong et al. | |
| 6,307,272 B1 | 10/2001 | Takahashi et al. | 7,211,471 B1 | 5/2007 | Foster | |
| 6,309,909 B1 | 10/2001 | Ohgiyama | 7,242,100 B2 * | 7/2007 | Oka | 257/778 |
| 6,316,822 B1 | 11/2001 | Venkateshwaran et al. | 7,245,007 B1 | 7/2007 | Foster | |
| 6,316,838 B1 | 11/2001 | Ozawa et al. | 7,508,055 B2 * | 3/2009 | Katou et al. | 257/676 |
| 6,323,550 B1 | 11/2001 | Martin et al. | 2001/0008305 A1 | 7/2001 | McClellan et al. | |
| 6,326,243 B1 | 12/2001 | Suzuya et al. | 2001/0014538 A1 | 8/2001 | Kwan et al. | |
| 6,326,244 B1 | 12/2001 | Brooks et al. | 2002/0011654 A1 | 1/2002 | Kimura | |
| 6,326,678 B1 | 12/2001 | Karmezos et al. | 2002/0024122 A1 | 2/2002 | Jung et al. | |
| 6,335,564 B1 | 1/2002 | Pour | 2002/0027297 A1 | 3/2002 | Ikenaga et al. | |
| 6,337,510 B1 | 1/2002 | Chun-Jen et al. | 2002/0038873 A1 | 4/2002 | Hiyoshi | |
| 6,339,252 B1 | 1/2002 | Niones et al. | 2002/0047185 A1 * | 4/2002 | Carter et al. | 257/666 |
| 6,339,255 B1 | 1/2002 | Shin | 2002/0111009 A1 | 8/2002 | Huang et al. | |
| 6,348,726 B1 | 2/2002 | Bayan et al. | 2002/0140061 A1 | 10/2002 | Lee | |
| 6,355,502 B1 | 3/2002 | Kang et al. | 2002/0140068 A1 | 10/2002 | Lee et al. | |
| 6,362,525 B1 | 3/2002 | Rahim | 2002/0140081 A1 | 10/2002 | Chou et al. | |
| 6,369,447 B2 | 4/2002 | Mori | 2002/0163015 A1 | 11/2002 | Lee et al. | |
| 6,369,454 B1 | 4/2002 | Chung | 2002/0167060 A1 | 11/2002 | Buijsman et al. | |
| 6,373,127 B1 | 4/2002 | Baudouin et al. | 2003/0006055 A1 | 1/2003 | Chien-Hung et al. | |
| 6,377,464 B1 | 4/2002 | Hashemi et al. | 2003/0030131 A1 | 2/2003 | Lee et al. | |
| 6,380,048 B1 | 4/2002 | Boon et al. | 2003/0059644 A1 | 3/2003 | Datta et al. | |
| 6,384,472 B1 | 5/2002 | Huang | 2003/0073265 A1 | 4/2003 | Hu et al. | |
| 6,388,336 B1 | 5/2002 | Venkateshwaran et al. | 2003/0102537 A1 | 6/2003 | McLellan et al. | |
| 6,395,578 B1 | 5/2002 | Shin et al. | 2003/0164554 A1 | 9/2003 | Fee et al. | |
| 6,399,415 B1 | 6/2002 | Bayan et al. | 2003/0168719 A1 | 9/2003 | Cheng et al. | |
| 6,400,004 B1 | 6/2002 | Fan et al. | 2003/0198032 A1 | 10/2003 | Collander et al. | |
| 6,410,979 B2 | 6/2002 | Abe | 2004/0027788 A1 | 2/2004 | Chiu et al. | |
| 6,414,385 B1 | 7/2002 | Huang et al. | 2004/0056271 A1 | 3/2004 | Karnezos | |
| 6,420,779 B1 | 7/2002 | Sharma et al. | 2004/0061204 A1 * | 4/2004 | Han et al. | 257/666 |
| 6,421,013 B1 | 7/2002 | Chung | 2004/0061212 A1 | 4/2004 | Karnezos | |
| 6,429,508 B1 | 8/2002 | Gang | 2004/0061213 A1 | 4/2004 | Karnezos | |
| 6,437,429 B1 | 8/2002 | Su et al. | 2004/0063242 A1 | 4/2004 | Karnezos | |
| 6,444,499 B1 | 9/2002 | Swiss et al. | 2004/0063246 A1 | 4/2004 | Karnezos | |
| 6,448,633 B1 | 9/2002 | Yee et al. | 2004/0065963 A1 | 4/2004 | Karnezos | |
| 6,452,279 B2 | 9/2002 | Shimoda | 2004/0080025 A1 | 4/2004 | Kasahara et al. | |
| 6,459,148 B1 | 10/2002 | Chun-Jen et al. | 2004/0089926 A1 | 5/2004 | Hsu et al. | |
| 6,464,121 B2 | 10/2002 | Reijinders | 2004/0097016 A1 * | 5/2004 | Yee et al. | 438/124 |
| 6,465,883 B2 | 10/2002 | Oloffson | 2004/0164387 A1 | 8/2004 | Ikenaga et al. | |
| 6,475,646 B2 | 11/2002 | Park et al. | 2005/0056914 A1 * | 3/2005 | Hong et al. | 257/666 |
| 6,476,469 B2 | 11/2002 | Hung et al. | 2005/0139969 A1 * | 6/2005 | Lee et al. | 257/672 |
| 6,476,474 B1 | 11/2002 | Hung | 2005/0199987 A1 * | 9/2005 | Danno et al. | 257/672 |
| 6,482,680 B1 | 11/2002 | Khor et al. | 2005/0253280 A1 * | 11/2005 | Katou et al. | 257/782 |
| 6,483,178 B1 | 11/2002 | Chuang | 2007/0023202 A1 | 2/2007 | Shibata | |
| 6,498,099 B1 | 12/2002 | McClellan et al. | 2007/0029648 A1 * | 2/2007 | Gerber et al. | 257/666 |
| 6,498,392 B2 | 12/2002 | Azuma | 2008/0036051 A1 * | 2/2008 | Espiritu et al. | 257/666 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

FUSION QUAD FLAT SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to an increased capacity QFP semiconductor package which includes exposed leads and an exposed die pad on the bottom surface of the package body thereof.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such as cell phones, PDA's and Bluetooth, there is an increasing need for QFP exposed pad packages of increased functional capacity. The present invention provides such a QFP exposed pad package which includes exposed leads and an exposed die pad on the bottom surface of the package body thereof. The semiconductor package of the present invention is provided through the use of standard, low-cost leadframe design techniques. These, as well as other features and attributes of the present invention will be discussed in more detail below.

BRIEF SUMMARY OF THE INVENTION

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die paddle defining multiple peripheral edge segments and a plurality of leads, the exposed portions of which are segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of at least one row thereof being exposed in a common exterior surface of the package body. The leadframe of each embodiment of the semiconductor package is fabricated in accordance with standard, low-cost forming techniques. In certain embodiments of the present invention, sawing or similar cutting procedures are completed during the fabrication of the semiconductor package which effectively electrically isolate various sets of the leads from each other within the completed semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
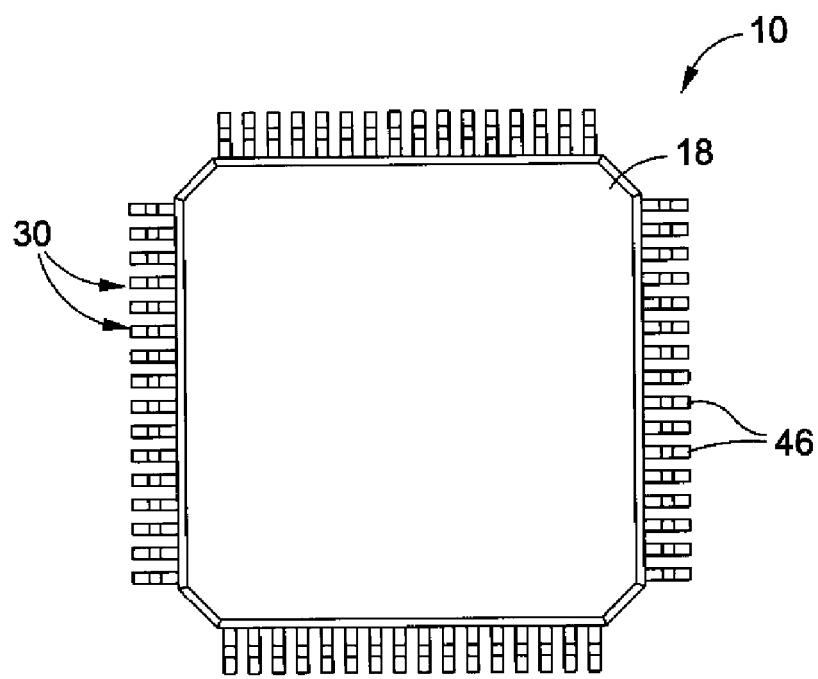
FIG. 1 is a top plan view of a semiconductor package constructed in accordance with a first embodiment of the present invention.

Referring now to the drawings wherein the showings are for purposes of illustrating various embodiments of the present invention only, and not for purposes of limiting the same, FIGS. 1-5 depict a semiconductor package 10 constructed in accordance with a first embodiment of the present invention. The major structural elements of the semiconductor package 10 include a leadframe 12 (shown in FIG. 4), a semiconductor die 14 attached to the leadframe 12 and electrically connected thereto by conductive wires 16, and a package body 18 which fully encapsulates the semiconductor die 14 and wires 16, and partially encapsulates the leadframe 12 in a manner which will be described in more detail below.

The leadframe 12 of the semiconductor package 10 includes a peripheral outer dambar 20 which defines a central opening 22. Located within the central opening 22 is a generally quadrangular die paddle 24 of the leadframe 12. The die paddle 24 defines opposed, generally planar top and bottom paddle surfaces, and is connected to the dambar 20 by a plurality of tie bars 26 which extend diagonally from respective ones of the four corners defined by the die paddle 24.

Figure 4:
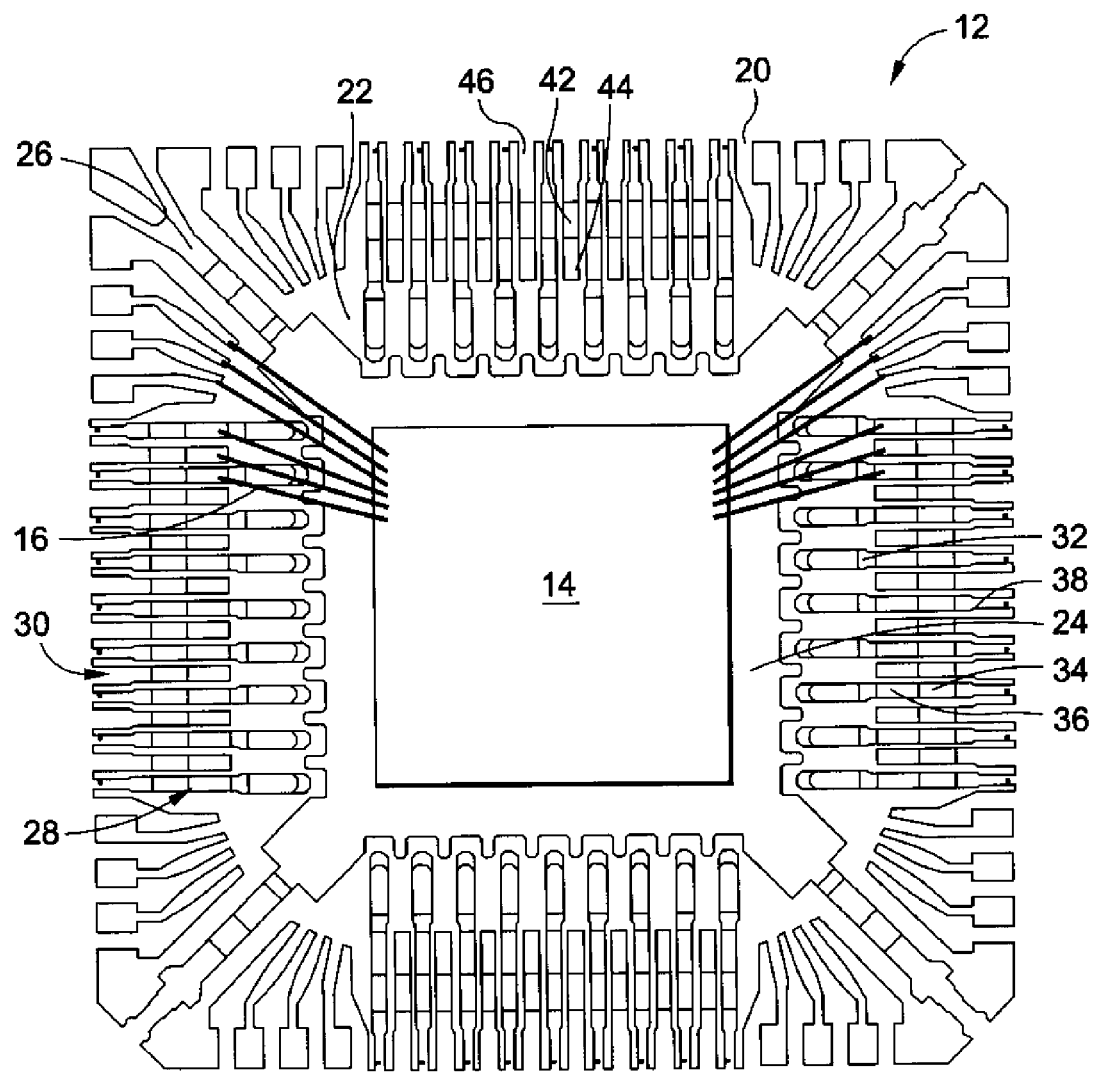
FIG. 4 is a top plan view of the unsingulated leadframe which is integrated into the semiconductor package of the first embodiment of the present invention, further depicting the semiconductor die of the semiconductor package as attached to the die pad of the leadframe.
Figure 3:
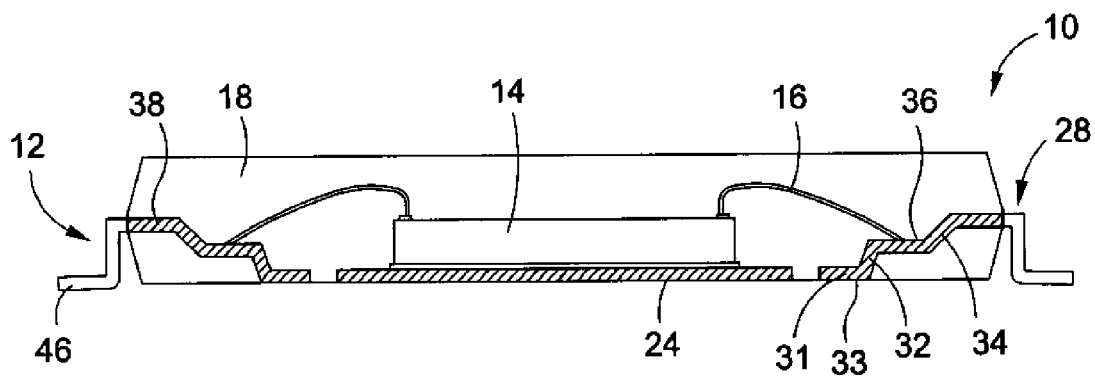
FIG. 3 is a cross-sectional view of the semiconductor package of the first embodiment of the present invention taken along line 3-3 of FIG. 2.

In addition to the die paddle 24, the leadframe 12 of the semiconductor package 10 comprises a plurality of first leads 28 and a plurality of second leads 30 which are each connected to the dambar 20. As seen in FIG. 4, the first leads 28 are segregated into four sets, with the first leads 28 of each set extending along and in spaced relation to a respective one of the four peripheral edge segments defined by the die paddle 24. Similarly, the second leads 30 are also segregated into four sets, with the second leads 30 of each set also extending along and in spaced relation to a respective one of the four peripheral edge segments defined by the die paddle 24. As is further seen in FIG. 4, some of the second leads 30 of each set thereof are interleaved with the first leads 28 of the corresponding set, i.e., certain ones of the second leads 30 of each set extend between and in spaced relation to a respective pair of the first leads 28 of the corresponding set thereof. Those second leads 30 of each set which extend between a respective pair of the first leads 28 are each generally straight, though being bent to define a downset as will be described in more detail below. Those second leads 30 of each set which are not interleaved with the first leads 28 of the corresponding set each preferably have an inner end portion which is angled relative to the remainder thereof. More particularly, in those second leads 30 having angled inner end portions, the angular displacement of the inner end portions relative to the corresponding segment of the dambar 20 to which such second leads 30 are integrally connected progressively increases as such second leads 30 approach an adjacent one of the tie bars 26.

In the semiconductor package 10, each of the first leads 28 defines a distal, inner end portion 31 and includes a first downset 32 formed therein in relative close proximity to the inner end portion 31. In this regard, the inner end portion 31 of each first lead 28 is disposed between the first downset 32 thereof and the die paddle 24. The inner end portion 31 defines opposed top and bottom surfaces which extend in generally coplanar relation to respective ones of the top and bottom paddle surfaces defined by the die paddle 24. The bottom surface of the inner end portion 31 of each first lead 28 further defines a terminal 33 of the semiconductor package 10, the use of which will be described in more detail below. In addition to the first downset 32, each of the first leads 28 includes a second downset 34 formed therein between the first downset 32 and the dambar 20. Defined between the first and second downsets 32, 34 is a wire bond zone 36 which extends in spaced, generally parallel relation to the die paddle 24 and hence the inner end portion 31 of the corresponding first lead 28. Each first lead 28 further defines an outer end portion 38 which also extends in spaced, generally parallel relation to the die paddle 24, and is located between the second downset 34 and the dambar 20.

Figure 5:
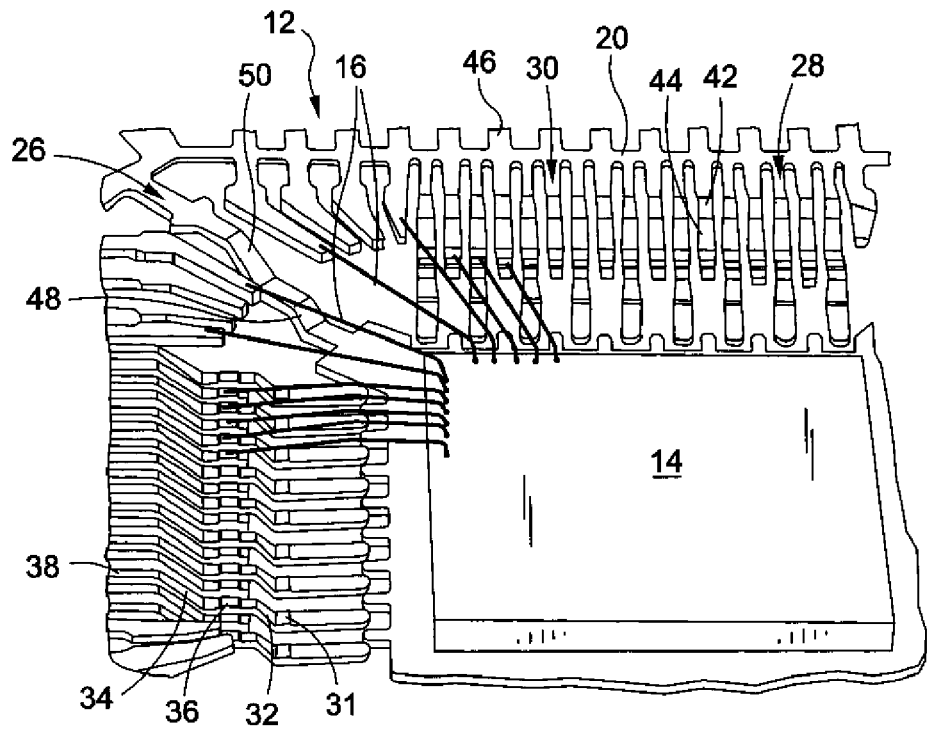
FIG. 5 is a partial, top perspective view of the leadframe and semiconductor die shown in FIG. 4.
Figure 6:
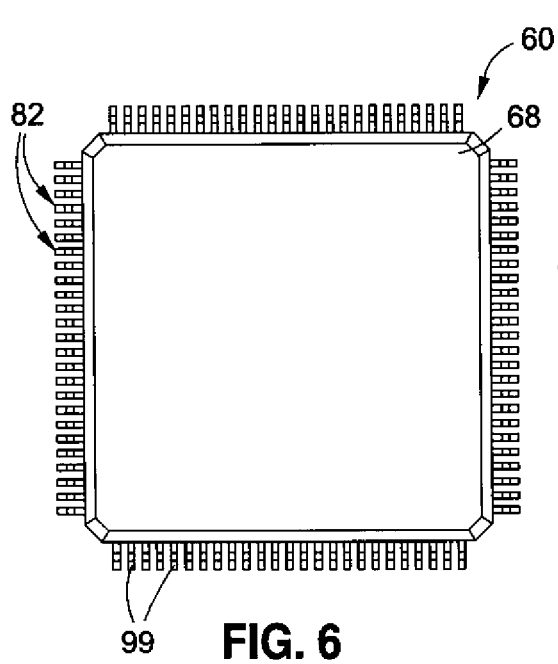
FIG. 6 is a top plan view of a semiconductor package constructed in accordance with a second embodiment of the present invention.

Similar to the first leads 28, those second leads 30 which do not include an angled inner end portion each includes a downset 42 formed therein. As a result of the formation of the downset 42 therein, each such second lead 30 defines a wire bond zone 44 which is disposed between the downset 42 and the die paddle 24, and extends in generally co-planar relation to the wire bond zones 36 of the first leads 28. Each second lead 30 further defines an outer end portion 46. For those second leads 30 including the downset 42, the outer end portion 46 extends between the downset 42 and a corresponding segment of the dambar 20, and outwardly beyond such segment of the dambar 20 as best seen in FIG. 5. For those second leads 30 including the angled inner end portion, the outer end portion 46 is attached to and extends outwardly beyond a corresponding segment of the dambar 20. The outer end portions 46 of the second leads 30 extend in generally coplanar relation to the outer end portions 38 of the first leads 28, with the outer end portions 38, 46 all extending in generally coplanar relation to the dambar 20.

As is further seen in FIG. 5, each of the tie bars 26 is formed to include first and second downsets 48, 50 essentially mirroring the size and location of respective ones of the first and second downsets 32, 34 of each of the first leads 20, thus effectively suspending the die paddle 24 within the opening 22 defined by the dambar 20 in substantially co-planar relation to the inner end portions 31 of the first leads 28 as described above. As a result of the formation of the first and second downsets 48, 50 in each of the tie bars 26, the die paddle 24 of the leadframe 12 results on a plane which is disposed below the plane of the dambar 20, as well as the wire bond zones 36, 44 of the first and second leads 28, 30 integrally connected to the dambar 20. In particular, the die paddle 24 and the inner end portions 31 of the first leads 28 reside on a common first plane, with the wire bond zones 36 of the first leads 28 and the wire bond zones 44 of the second leads 30 residing on a second plane which is disposed in spaced, generally parallel relation to the first plane. The outer end portions 38 of the first leads 28, the outer end portions 46 of the second leads 30, and the dambar 20 each reside on a third plane which is itself disposed in spaced, generally parallel relation to the first and second planes, the second plane being disposed between the first and third planes. As also indicated above, it is contemplated that the terminal 33 defined by the inner end portion 31 of each of the first leads 38 will extend in generally co-planar relation to the bottom paddle surface of the die paddle 24, with the top surface of each inner end portion 31 which is opposed to the terminal 33 defined thereby extending in generally co-planar relation to the top paddle surface of the die paddle 24. Though not shown in FIGS. 3-5, it is contemplate that elongate strips of lead lock tape may be applied to the leadframe 12 so as to span the space or gap defined between the inner end portions 31 of the first leads 28 and the die paddle 24. If applied to the leadframe 12, such tape strips would cover portions of the top surfaces of the inner end portions 31 opposite the terminals 33 defined thereby, and a peripheral portion of the top surface of the die paddle 24. As will be recognized by those of ordinary skill in the art, the attachment of the lead lock tape to the leadframe 12 would provide increased mechanical stability/support for the leadframe 12, and further assist in maintaining the coplanarity of the die paddle 24 and the first leads 28.

The leadframe 12 of the semiconductor package 10 is preferably fabricated from a conventional metal material, such as copper, copper alloy, steel plated with copper, or a functional equivalent. However, those of ordinary skill in the art will recognize that the present invention is not limited to any particular material for the leadframe 12. Additionally, the number of first and second leads 28, 30 shown in FIG. 4 is for illustrative purposes only, and may be modified according to application field. Along these lines, the first and second leads 28, 30 may have designs or configurations varying from those shown in FIG. 4 without departing from the spirit and scope of the present invention. Additionally, though the first and second leads 28, 30 are each shown as each being segregated into four sets, it will be recognized that fewer sets of the first and second leads 28, 30 may be provided, and may be arranged along any combination of two or three of the peripheral sides of the die paddle 24. Moreover, less than four tie bars 26 may be included in the leadframe 12, extending to respective corners of the die paddle 24 in any combination. It is further contemplated that the leadframe 12 may be fabricated through the implementation of a chemical etching process or alternatively a mechanical stamping process. The above-described potential structural variations are also applicable to the leadframes of the alternative embodiments of the semiconductor package which will be described in more detail below.

In the semiconductor package 10, the semiconductor die 14 is attached to the top paddle surface of the die paddle 24, such attachment preferably being facilitated through the use of a suitable die attach material, such as an adhesive. Included on the top surface of the semiconductor die 14 is a plurality of bond pads or terminals. In the semiconductor package 10, these terminals of the semiconductor die 14 are electrically connected to respective ones of the first and second leads 28, 30 through the use of the conductive wires 16. In FIG. 4, only a few exemplary wires 16 are depicted, those of ordinary skill in the art recognizing that the semiconductor package 10 will typically include wires 16 in a suitable number which effectively electrically connects the semiconductor die 14 to virtually all of the first and second leads 28, 30 included in the leadframe 12. It is contemplated that for each first lead 28, a corresponding wire 16 will be extended to the wire bond zone 36 defined thereby. For each second lead 30 which includes a downset 42, it is contemplated that the corresponding wires 16 may be extended to the wire bond zone 44 defined thereby. For each second lead 30 including an angled inner end portion, the conductive wire 16 will be extended to the outer end portion 46 thereof. However, it is also contemplated that the wires 16 may also be extended to the outer end portions 38 of the first leads 28, and/or the outer end portions 46 of the second leads 30 which include the downsets 42. The conductive wires 16 may be fabricated from aluminum, copper, gold, silver, or a functional equivalent. However, those of ordinary skill in the art will recognize that the present invention is not limited to any particular material for the wires 16.

Figure 2:
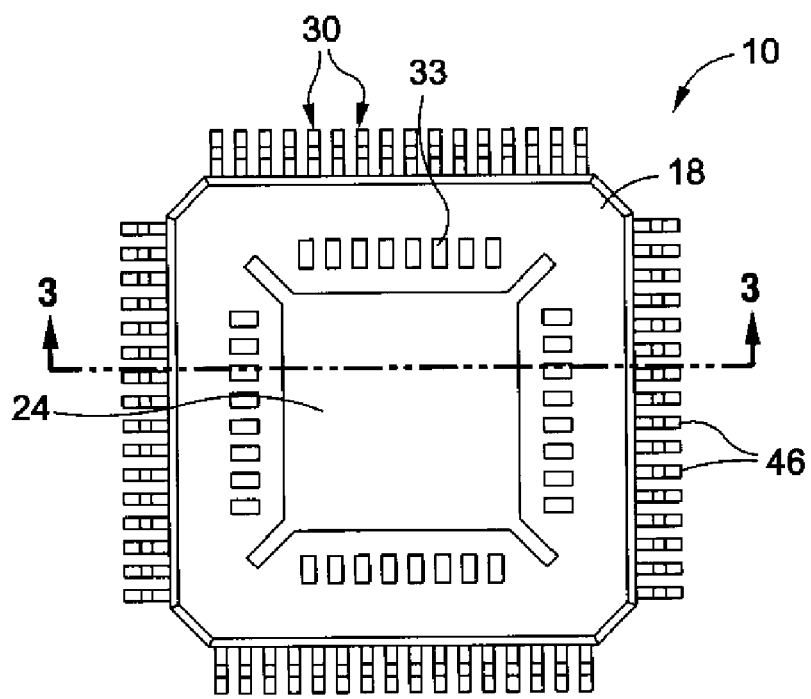
FIG. 2 is a bottom plan view of the semiconductor package shown in FIG. 1.

In the semiconductor package 10, the die paddle 24, the first and second leads 28, 30, the semiconductor die 14 and the conductive wires 16 are encapsulated or covered by an encapsulant material, which, upon hardening, forms the package body 18 of the semiconductor package 10. As best seen in FIG. 2, in the completed semiconductor package 10, the generally planar terminals 33 defined by the inner end portions 31 of the first leads 28 are exposed in and substantially flush with a generally planar bottom surface defined by the fully formed package body 18. Also exposed in and substantially flush with the bottom surface of the package body 18 is the generally planar bottom paddle surface of the die paddle 24. Distal portions of the outer end portions 46 of the second leads 30 protrude from respective ones of multiple side surfaces defined by the package body 18. These exposed portions of the outer end portions 46 of the second leads 30 are preferably bent so as to impart a generally gull-wing configuration thereto in the manner shown in FIGS. 1, 2 and 3. Other than for the terminals 33 of the first leads 28 and those portions of the second leads 30 protruding from the side surfaces of the package body 18, it is contemplated that virtually all of the remainder of each of the first and second leads 28, 30 will be covered by the package body 18.

In fabricating the semiconductor package 10, the package body 18 is formed on the leadframe 12 such that the dambar 20 is not covered by the package body 18, and thus remains exposed therein. As will be recognized, in order to complete the fabrication of the semiconductor package 10 to allow the same to assume the configuration shown in FIGS. 1 and 2, the dambar 20 must be removed from the leadframe 12 to facilitate the electrical isolation of the first and second leads 28, 30 from each other. In this regard, it is contemplated that a conventionally known debarring process may be implemented to remove the dambar 20 as needed to electrically isolate the first leads 28 and the second leads 30 from each other. The completion of such debarring process results in each of the first leads 28 defining an outer, distal end which is exposed in and substantially flush with a respective side surface defined by the package body 18. Further, upon the completion of such debarring process, the exposed portions of the second leads 30 may be bent in the above-described manner to assume the gull-wing configurations. Advantageously, in the semiconductor package 10, the connection of the first and second leads 28, 30 to the common dambar 20 maintains tight positional consistency in relation to the terminals 33 of the first leads 28 and exposed outer end portions 46 of the second leads 30. Further, the encapsulation of the first and second downsets 32, 34 of the first leads 28 and downsets 42 of the second leads 30 by the package body 18 facilitates the anchoring or locking of the first and second leads 28, 30 to the package body 18, thus eliminating the need to form any locking features therein via a half-etching or coining technique.

Referring now to FIGS. 6-10, there is depicted a semiconductor package 60 constructed in accordance with a second embodiment of the present invention. The major structural elements of the semiconductor package 60 include a leadframe 62, a semiconductor die 64 attached to the leadframe 62 and electrically connected thereto by conductive wires 66, and a package body 68 which fully encapsulates the semiconductor die 64 and wires 66 and partially encapsulates the leadframe 62 in a manner which will be described in more detail below.

Figure 9:
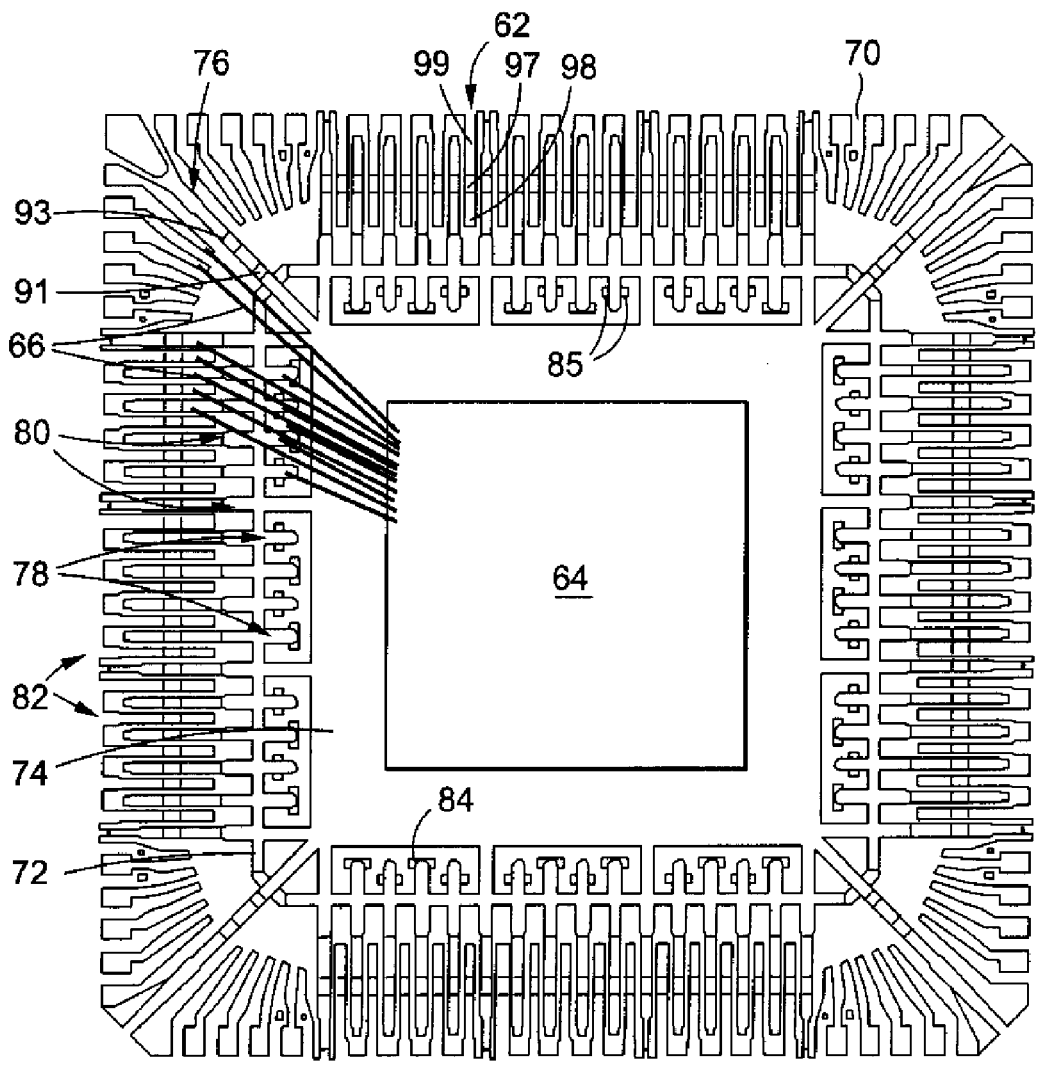
FIG. 9 is a top plan view of the unsingulated leadframe which is integrated into the semiconductor package of the second embodiment of the present invention, further depicting the semiconductor die of the semiconductor package as attached to the die pad of the leadframe.
Figure 10:
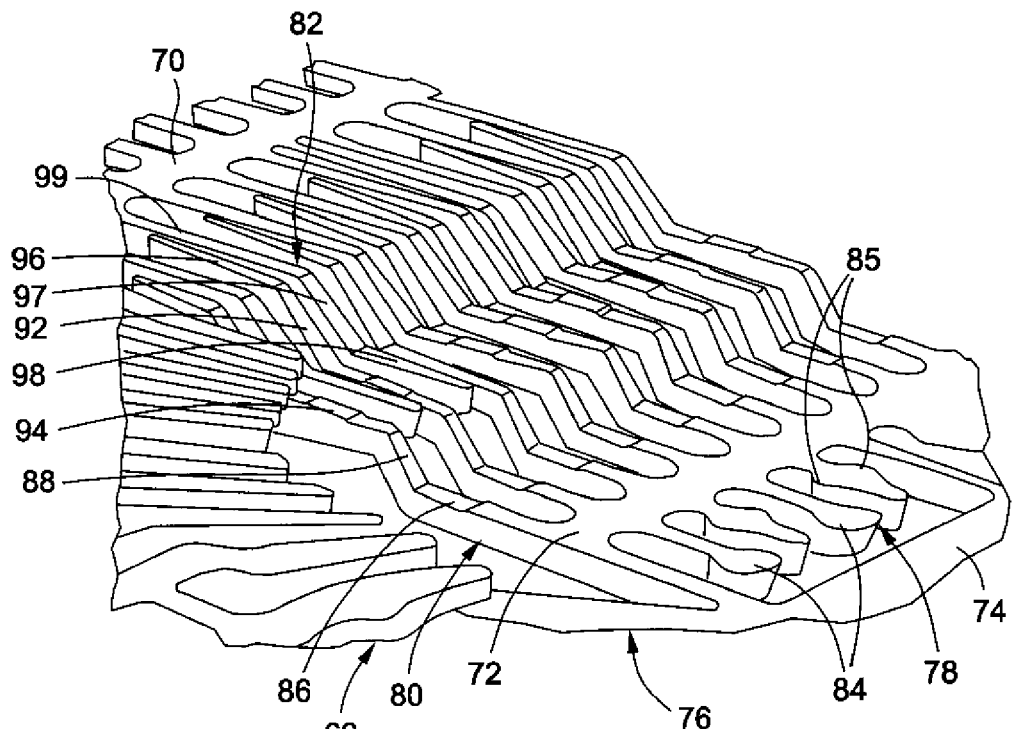
FIG. 10 is a partial, top perspective view of the leadframe and semiconductor die shown in FIG. 9.

As best seen in FIGS. 9 and 10, the leadframe 62 of the semiconductor package 60 includes a peripheral outer dambar 70. Located within outer dambar 70 is a continuous, generally quadrangular tie ring 72. Disposed within the tie ring 72 is a generally quadrangular die paddle 74 of the leadframe 62. The die paddle 74 defines opposed, generally planar top and bottom paddle surfaces, and is connected to both the tie ring 72 and the dambar 70 by a plurality of tie bars 76 which extend diagonally from respective ones of the four corners defined by the die paddle 74.

In addition to the die paddle 74, the leadframe 62 of the semiconductor package 60 comprises a plurality of first leads 78 which are each integrally connected to the tie ring 72 and extend inwardly toward the die paddle 74 in spaced relation thereto, and a plurality of second leads 80 which are each integrally connected to and extend outwardly from the tie ring 72 toward the dambar 70. In addition to the first and second leads 78, 80, the leadframe 62 includes a plurality of third leads 82 which are each integrally connected to the dambar 70. As seen in FIG. 9, the first leads 78 and the second leads 80 are each segregated into four sets, with the first leads 78 and the second leads 80 of each set extending along a respective one of the four peripheral edge segments defined by the die paddle 74. In the leadframe 62, certain ones of the first leads 78 of each set are of increased length and are also each integrally connected to the die paddle 74 in addition to the tie ring 72, such first leads 78 defining signal pins which extend between the tie ring 72 and the die paddle 74. The third leads 82 are also segregated into four sets, with the third leads 82 of each set extending along a respective one of the four peripheral edge segments defined by the die paddle 74 in spaced relation thereto. Thus, the first, second and third leads 78, 80, 82 are generally arranged as three concentric rings, the first leads 78 defining an inner ring which is circumvented or circumscribed by a middle ring defined by the second leads 80, such middle ring itself being circumvented by an outer ring defined by the third leads 82.

As further seen in FIG. 9, some of the third leads 82 of each set thereof are interleaved with the second leads 80 of the corresponding set, i.e., certain ones of the third leads 82 of each set extend between and in spaced relation to a respective pair of the second leads 80 of the corresponding set thereof. Those third leads 82 of each set which extend between a respective pair of the second leads 80 are each generally straight, though being bent to define a downset as will be described in more detail below. Those third leads 82 of each set which are not interleaved with the second leads 80 of the corresponding set each preferably have an inner end portion which is angled relative to the remainder thereof. More particularly, in those third leads 82 having angled inner end portions, the angular displacement of the inner end portions relative to the corresponding segment of the dambar 70 to which such third leads 82 are integrally connected progressively increases as such third leads 82 approach an adjacent one of the tie bars 76. Each of the first leads 78 of each set thereof is substantially aligned with a respective one of the second leads 80 of the corresponding set thereof. Those second leads 80 of each set which are aligned with one of the first leads 78 of the corresponding set defining a signal pin are further integrally connected to the dambar 70, and thus extend between the tie ring 72 and the dambar 70.

In the semiconductor package 60, each of the first leads 78 defines opposed, generally planar top and bottom lead surfaces, the bottom lead surfaces defining terminals 79 of the semiconductor package 60 which will be discussed in more detail below. Additionally, of those first leads 78 of each set which are not integrally connected to the die paddle 74 and thus do not define signal pins, every other one of such first leads 78 includes an enlarged inner end or tip structure 84 which may be formed through the implementation of a partial (half) etching procedure or a coining procedure, and is used to provide a locking feature to strengthen the engagement between the first leads 78 and the package body 68 subsequent to the singulation or removal of the tie ring 72 as will also be discussed in more detail below. If such locking feature is provided, it is contemplated that each first lead 78 will include a shoulder or shelf which is recessed relative to the bottom lead surface thereof and defines the bottom surface of the tip structure 84, such shoulder or shelf further being disposed in opposed relation to that portion of the top lead surface of the corresponding first lead 78 which defines the top surface of the tip structure 84. However, those remaining first leads 78 which do not define signal pins and do not include the tip structure 84 are each formed to include an opposed pair of laterally extending ear portions 85. It is contemplated that such ear portions 85 will also be formed through the implementation of a half-etching procedure, and used to provide a locking feature to strengthen the engagement between those first leads 78 including such ear portions 85 and the package body 68. For those first leads 78 including the ear portions 85 as an alternative to the above-described tip structure 84, it is contemplated that such first leads 78 will include an opposed pair of shoulders or shelves which are recessed relative to the bottom lead surface thereof and define the bottom surfaces of respective ones of the ear portions 85, such shoulders or shelves further being disposed in opposed relation to those portions of the top lead surface of the corresponding first lead 78 which defines the top surfaces of the ear portions 85. Those of ordinary skill in the art will recognize that the above-described tip structure 84 described in relation to certain ones of the first lead 78 may optionally be substituted with ear portions similar to the ear portions 85 described above.

In the semiconductor package 60, each of the second leads 80 defines an inner end portion 86 which extends and is attached to a corresponding segment of the tie ring 72. Each of the second leads 80 also includes a first downset 88 formed therein in relative close proximity to the inner end portion 86. In this regard, the inner end portion 86 of each second lead 80 is disposed between the first downset 88 thereof and the tie ring 72. The inner end portion 86 defines opposed top and bottom surfaces which extend in generally coplanar relation to respective ones of the top and bottom paddle surfaces defined by the die paddle 74. The bottom surface of the inner end portion 86 of each second lead 80 further defines a terminal 90 of the semiconductor package 60, the use of which will be described in more detail below. In addition to the first downset 88, each of the second leads 80 includes a second downset 92 formed therein between the first downset 88 and the dambar 70. Defined between the first and second downsets 88, 92 is a wire bond zone 94 which extends in spaced, generally parallel relation to the die paddle 74 and hence the inner end portion 86 of the corresponding second lead 80. Each second lead 80 further defines an outer end portion 96 which also extends in spaced, generally parallel relation to the die paddle 74, and is located between the second downset 92 and the dambar 70.

Similar to the second leads 80, those third leads 82 which do not include an angled inner end portion each includes a downset 97 formed therein. As a result of the formation of the downset 97 therein, each such third lead 82 defines a wire bond zone 98 which is disposed between the downset 97 and the tie ring 72, and extends in generally co-planar relation to the wire bond zones 94 of the second leads 80. Each third lead 82 further defines an outer end portion 99. For those third leads 82 including the downset 97, the outer end portion 99 extends between the downset 97 and a corresponding segment of the dambar 70, and outwardly beyond such segment of the dambar 70 as best seen in FIG. 10. For those third leads 82 including the angled inner end portion, the outer end portion 99 is attached to and extends outwardly beyond a corresponding segment of the dambar 70. The outer end portions 96 of the second leads 80 extend in generally coplanar relation to the outer end portions 99 of the third leads 82, with the outer end portions 96, 99 all extending in generally coplanar relation to the dambar 70.

As is seen in FIG. 9, each of the tie bars 76 is formed to include first and second downsets 91, 93 essentially mirroring the size and location of respective ones of the first and second downsets 88, 92 of each of the second leads 80, thus effectively suspending the die paddle 74 within the dambar 70 in a substantially co-planar relation to the first leads 78 and the inner end portions 86 of the second leads 80. As a result of the formation of the first and second downsets 91, 93 in each of the tie bars 76, the die paddle 74 of the leadframe 62 results on a plane which is disposed below the plane of the dambar 70, as well as the wire bond zones 94, 98 of the second and third leads 80, 82. In particular, the die paddle 74, the first leads 78 and the inner end portions 86 of the second leads 80 reside on a common first plane, with the wire bond zones 94, 98 of the second and third leads 80 residing on a second plane which is disposed in spaced, generally parallel relation to the first plane. The outer end portions 96, 99 of the second and third leads 80, 82 and the dambar 70 each reside on a third plane which is itself disposed in spaced, generally parallel relation to the first and second planes, the second plane being disposed between the first and third planes. It is also contemplated that the terminals 79, 90 defined by the each of the first and second leads 78, 80 will extend in generally co-planar relation to the bottom paddle surface of the die paddle 74 and to each other. Similarly, it is also contemplated that the top surface of each inner end portion 86 which is opposed to the terminal 90 defined thereby and the top surface of each first lead 78 which is opposed to the terminal 79 defined thereby will extend in generally co-planar relation to the top paddle surface of the die paddle 74 and to each other.

The leadframe 62 of the semiconductor package 60 is preferably fabricated from a conventional metal material, such as copper, copper alloy, steel plated with copper, or a functional equivalent. However, those of ordinary skill in the art will recognize that the present invention is not limited to any particular material for the leadframe 62. Additionally, the number of first, second and third leads 78, 80, 82 shown in FIG. 9 is for illustrative purposes only, and may be modified according to application field. Along these lines, the first, second and third leads 78, 80, 82 may have designs or configurations varying from those shown in FIG. 9 without departing from the spirit and scope of the present invention.

Additionally, though the first, second and third leads 78, 80, 82 are each shown as each being segregated into four sets, it will be recognized that fewer sets of the first, second and third leads 78, 80, 82 may be provided, and may be arranged along any combination of two or three of the peripheral sides of the die paddle 74. Moreover, less than four tie bars 76 may be included in the leadframe 62, extending to respective corners of the die paddle 74 in any combination. It is further contemplated that the leadframe 62 may be fabricated through the implementation of a chemical etching process or alternatively a mechanical stamping process.

In the semiconductor package 60, the semiconductor die 64 is attached to the top paddle surface of the die paddle 74, such attachment preferably being facilitated through the use of a suitable die attach material, such as an adhesive. Included on the top surface of the semiconductor die 74 is a plurality of bond pads or terminals. In the semiconductor package 60, these terminals of the semiconductor die 64 are electrically connected to respective ones of the first, second and third leads 78, 80, 82 through the use of the conductive wires 66. In FIG. 9, only a few exemplary wires 66 are depicted, those of ordinary skill in the art recognizing that the semiconductor package 60 will typically include wires 66 in a suitable number which effectively electrically connects the semiconductor die 64 to virtually all of the first, second and third leads 78, 80, 82 included in the leadframe 62. It is contemplated that for each first lead 78, a corresponding wire 66 will be extended to the top surface thereof opposite the terminal 79 defined thereby. For each second lead 80, it is contemplated that a corresponding wire 66 will be extended to the wire bond zone 94 defined thereby. For each third lead 82 which includes a downset 97, it is contemplated that the corresponding wire 66 may be extended to the wire bond zone 98 defined thereby. For each third lead 82 including an angled inner end portion, the conductive wire 66 will be extended to the outer end portion 99 thereof. However, it is also contemplated that the wires 66 may also be extended to the outer end portions 96 of the second leads 80, and/or the outer end portions 99 of the third leads 82 which include the downsets 97. The conductive wires 66 may be fabricated from aluminum, copper, gold, silver, or a functional equivalent. However, those of ordinary skill in the art will recognize that the present invention is not limited to any particular material for the wires 66.

Figure 7:
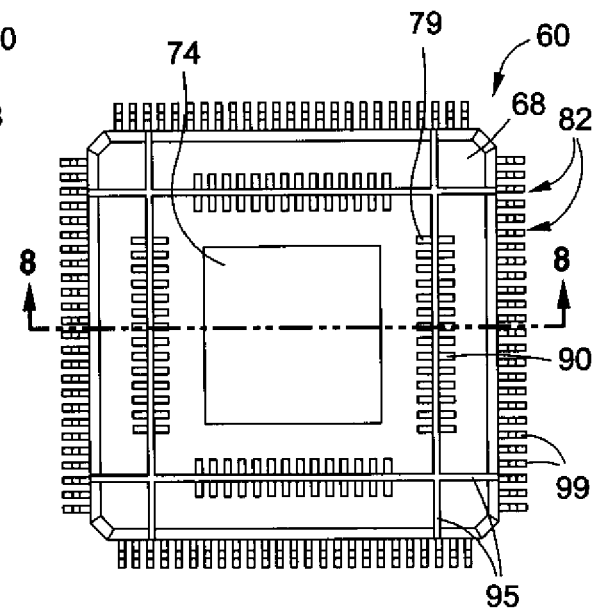
FIG. 7 is a bottom plan view of the semiconductor package shown in FIG. 6.
Figure 8:
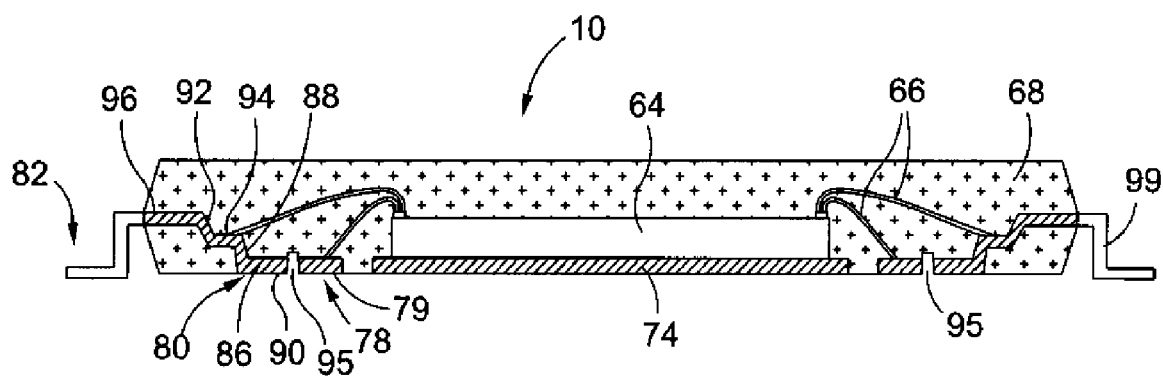
FIG. 8 is a cross-sectional view of the semiconductor package of the second embodiment of the present invention taken along line 8-8 of FIG. 7.

In the semiconductor package 60, the die paddle 74, the first, second and third leads 78, 80, 82, the semiconductor die 64 and the conductive wires 66 are encapsulated or covered by an encapsulant material, which, upon hardening, forms the package body 68 of the semiconductor package 10. As best seen in FIG. 7, in the completed semiconductor package 60, the generally planar terminals 79, 90 defined by the first and second leads 78, 80 are exposed in and substantially flush with a generally planar bottom surface defined by the fully formed package body 68. Also exposed in and substantially flush with the bottom surface of the package body 68 is the generally planar bottom paddle surface of the die paddle 74. Distal portions of the outer end portions 99 of the third leads 82 protrude from respective ones of multiple side surfaces defined by the package body 68. These exposed portions of the outer end portions 99 of the third leads 82 are preferably bent so as to impart a generally gull-wing configuration thereto in the manner shown in FIGS. 6-8. Other than for the terminals 79, 90 of the first and second leads 78, 80 and those portions of the third leads 82 protruding from the side surfaces of the package body 68, it is contemplated that virtually all of the remainder of each of the first, second and third leads 78, 80, 82 will be covered by the package body 68.

In fabricating the semiconductor package 60, the package body 18 is formed on the leadframe 62 such that the dambar 70 is not covered by the package body 68, and thus remains exposed therein. As will be recognized, in order to complete the fabrication of the semiconductor package 60 to allow the same to assume the configuration shown in FIGS. 6 and 7, the dambar 70 must be removed from the leadframe 62 to facilitate the electrical isolation of the second and third leads 80, 82 from each other. In this regard, it is contemplated that a conventionally known debarring process may be implemented to remove the dambar 70 as needed to electrically isolate the second leads 80 and the third leads 82 from each other. The completion of such debarring process results in each of the second leads 80 defining an outer, distal end which is exposed in and substantially flush with a respective side surface defined by the package body 68. Further, upon the completion of such debarring process, the exposed portions of the third leads 82 may be bent in the above-described manner to assume the gull-wing configurations.

In addition to electrically isolating the second and third leads 80, 82 from each other in the above-described manner, in fabricating the semiconductor package 60, it is further necessary to effectively facilitate the electrical isolation of the first and second leads 78, 80 from each other. In this regard, subsequent to the formation of the package body 68, it is contemplated that the package body 68 will be subjected to a partial sawing process. In this partial sawing process, a saw blade is penetrated into the bottom surface of the package body 68 to a depth and along axes which facilitate the severing or removal of the tie ring 72, thus electrically isolating the first leads 78 from each other and from the second leads 80. However, it will be recognized that the removal of the tie ring 72 does not electrically isolate any first leads 78 which define signal pins and remain integrally connected to the die paddle 74. The artifact which remains in the bottom surface of the package body 68 as a result of such partial sawing or singulation step are four elongate, generally straight grooves 95 which are arranged in a generally quadrangular pattern as shown in FIG. 7. Advantageously, in the semiconductor package 60, the connection of the first and second leads 78, 80 to the common tie ring 72 and the connection of the second and third leads 80, 82 to the common dambar 70 maintains tight positional consistency in relation to the relative orientations of the first, second and third leads 78, 80, 82. Further, the encapsulation of the first and second downsets 88, 92 of the second leads 80 and the downsets 97 of the third leads 82 by the package body 68 facilitates the anchoring or locking of the second and third leads 80, 82 to the package body 68, thus eliminating the need to form any locking features therein via a half-etching or coining technique. The locking of the first leads 78 to the package body 68 is facilitated by the above-described tip structures 84 and/or ear portions 85.

Figure 11:
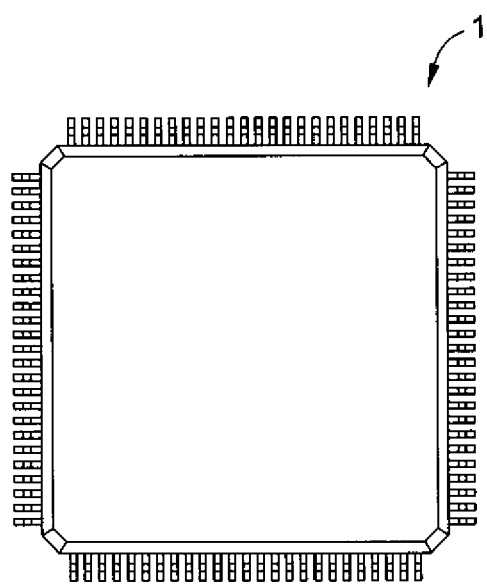
FIG. 11 is a top plan view of a semiconductor package constructed in accordance with a third embodiment of the present invention.
Figure 12:
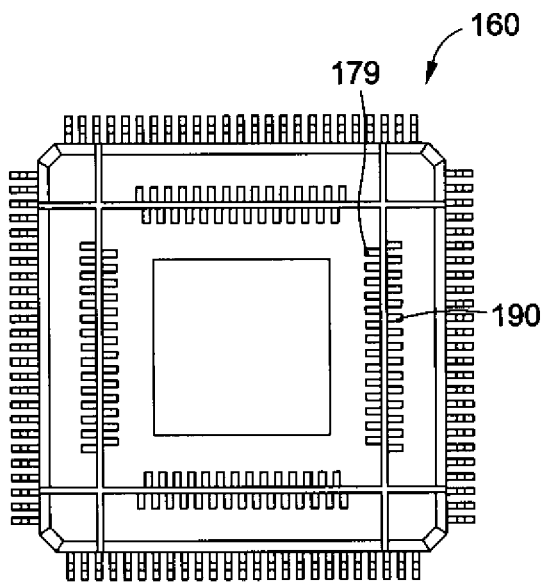
FIG. 12 is a bottom plan view of the semiconductor package shown in FIG. 11.
Figure 13:
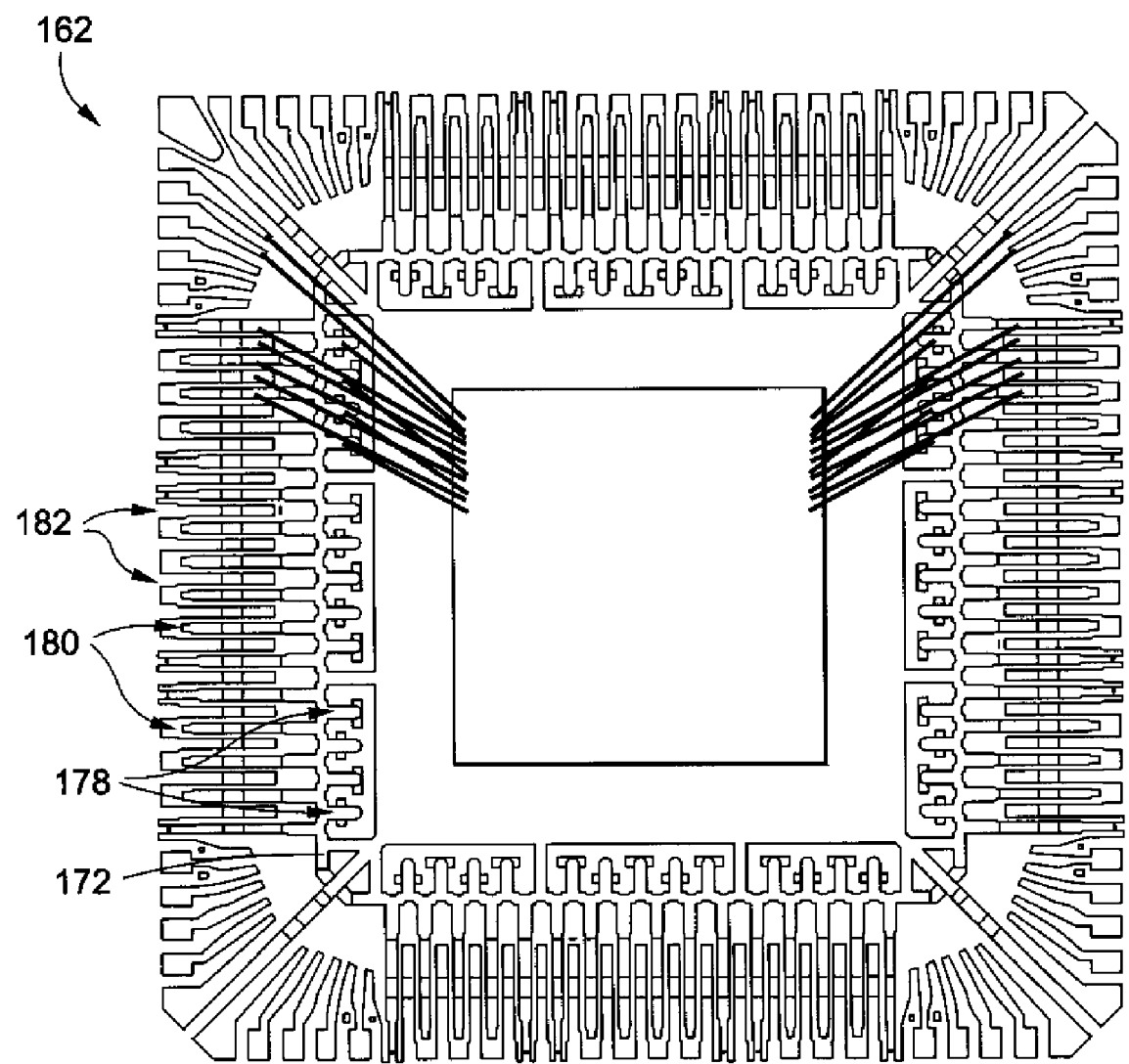
FIG. 13 is a top plan view of the unsingulated leadframe which is integrated into the semiconductor package of the third embodiment of the present invention, further depicting the semiconductor die of the semiconductor package as attached to the die pad of the leadframe.

Referring now to FIGS. 11, 12 and 13, there is shown a semiconductor package 160 which is constructed in accordance with a third embodiment of the present invention. The semiconductor package 160 is substantially similar in construction to the above-described semiconductor package 60, but includes a leadframe 162 which comprises a relatively minor variation of the leadframe 62 shown and described above. In this regard, only the distinctions between the semiconductor packages 60, 160 and in particular the leadframe 62, 162 thereof, will be described below. Along these lines, the one hundred series reference numbers included in FIGS. 11-13 are used to identify the same structures as identified by the corresponding ten series reference numbers included in FIGS. 6-10.

As previously indicated, in the leadframe 62, each of the first leads 78 of each set thereof is substantially aligned with a respective one of the second leads 80 of the corresponding set thereof, with those second leads 80 of each set which are aligned with one of the first leads 78 of the corresponding set defining a signal pin further being integrally connected to the dambar 70 and thus extending between the tie ring 72 and the dambar 70. In contrast, in the leadframe 162 shown in FIG. 13, the first and second leads 178, 180 are integrally connected to the common tie ring 172 so as to be disposed in a staggered or offset relationship relative to each other. Thus, none of the first leads 178 of any set thereof is linearly aligned with a respective one of the second leads 180 of the corresponding set thereof. Rather, each of the first leads 178 of each set thereof is linearly aligned with a respective one of those third leads 182 of the corresponding set thereof which do not include an angled inner end portion.

In the above-described semiconductor package 60, due to the alignment of the first leads 78 with respective ones of the second leads 80, each set of the terminals 79 defined by the first leads 78 is generally aligned with a respective one of the terminals 90 defined by the second leads 80 of the corresponding set in the manner shown in FIG. 7. However, as is best shown in FIG. 12, in the semiconductor package 160 including the leadframe 162, the terminals 179 defined by each set of the first leads 178 are staggered or offset relative to the terminals 190 defined by the corresponding set of the second leads 180 in the manner shown in FIG. 12.

Figure 14:
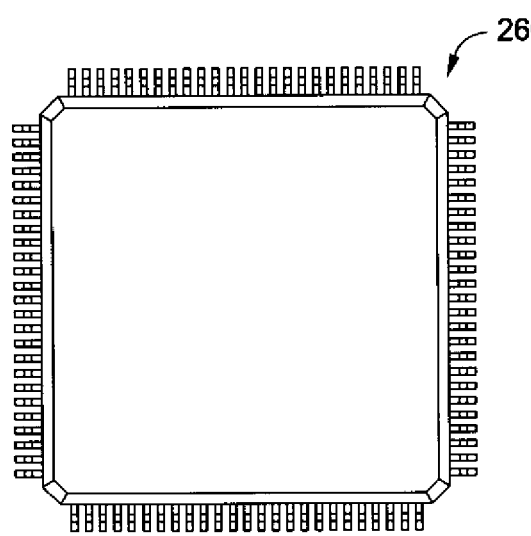
FIG. 14 is a top plan view of a semiconductor package constructed in accordance with a fourth embodiment of the present invention.
Figure 15:
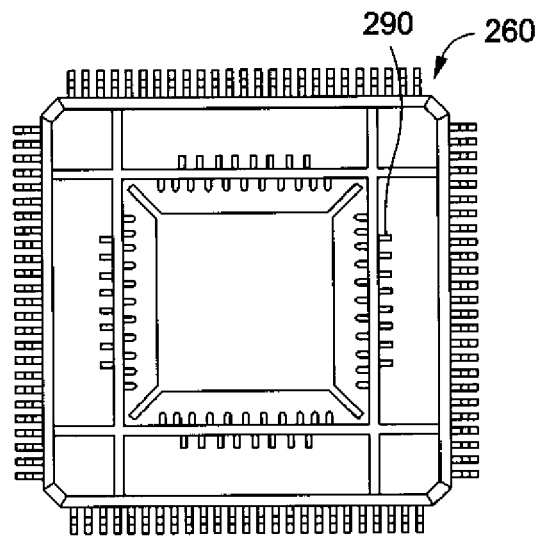
FIG. 15 is a bottom plan view of the semiconductor package shown in FIG. 14.
Figure 16:
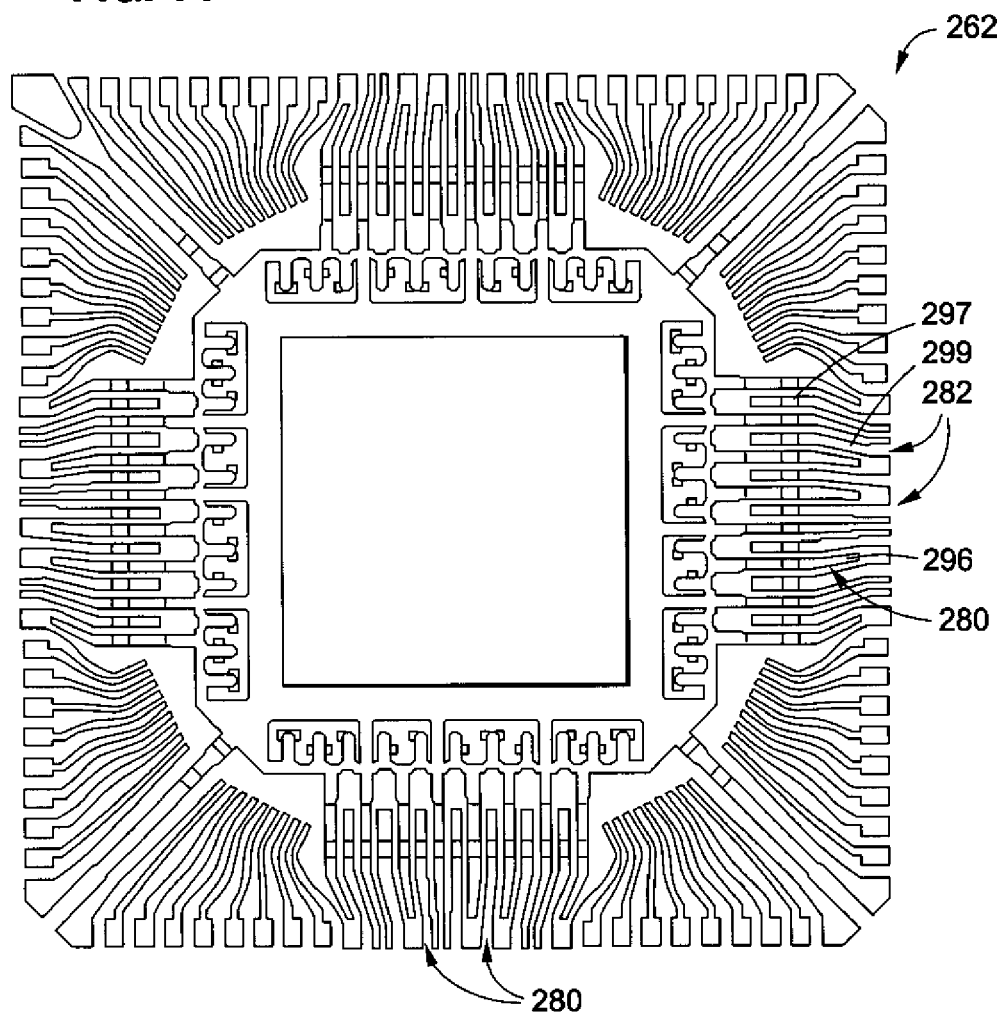
FIG. 16 is a top plan view of the unsingulated leadframe which is integrated into the semiconductor package of the fourth embodiment of the present invention, further depicting the semiconductor die of the semiconductor package as attached to the die pad of the leadframe.

Referring now to FIGS. 14-16, there is shown a semiconductor package 260 constructed in accordance with a fourth embodiment of the present invention. The semiconductor package 260 includes a leadframe 262 as shown in FIG. 16 which comprises a variation of the leadframe 162 shown and described above in relation to the semiconductor package 160. In this regard, only the distinctions between the semiconductor packages 160, 260, and in particular the leadframes 162, 262 thereof, will be described below. Along these lines, the two hundred series reference numbers included in FIGS. 14-16 are used to identify the same structures as identified by the corresponding ten series reference numbers included in FIGS. 6-10.

The leadframe 262 of the semiconductor package 260 comprises a fan-out version of the leadframe 162. In this regard, in the leadframe 262, the outer end portion 296 of each of the second leads 280 has a bent or angled section. Similarly, of those third leads 282 of each set which include the downsets 297, the outer end portion 299 of each such third lead 282 (except for the centermost third lead 282 of each set thereof) includes a bent or angled section as well. Advantageously, the inclusion of the angled sections in the outer end portions 296, 299 of the second and third leads 280, 282 of the leadframe 262 in the manner highlighted above enables variability in the pitch of the terminals 290 defined by the second leads 280.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a generally planar die paddle defining multiple peripheral edge segments;

a plurality of first leads which each include first and second downsets formed therein in spaced relation to each other, the first leads being segregated into at least two sets which extend along respective ones of at least two peripheral edge segments of the die paddle;

a plurality of second leads, at least some of which include a downset formed therein, the second leads being segregated into at least two sets which extend along respective ones of at least two peripheral edge segments of the die paddle;

a semiconductor die attached to the die paddle and electrically connected to at least one of each of the first and second leads; and a package body defining a generally planar bottom surface and multiple side surfaces, the package body at least partially encapsulating the first and second leads and the semiconductor die such that the first and second downsets of the first leads and the downsets of the second leads are covered by the package body, at least portions of the die paddle and the first leads are exposed in and substantially flush with the bottom surface of the package body, and portions of the second leads protrude from respective ones of the side surfaces of the package body.

2. The semiconductor package of claim 1 wherein the die paddle has a generally quadrangular configuration, and the first and second leads are segregated into at least four sets which each extend along a respective one of the peripheral edge segments of the die paddle.

3. The semiconductor package of claim 1 wherein the semiconductor die is electrically connected to the first and second leads by conductive wires which are covered by the package body.

4. The semiconductor package of claim 3 wherein:
each of the first leads includes an inner end portion, a wire bond zone, and an outer end portion, the inner end portion being disposed between the first downset thereof and the die paddle and defining a terminal which is exposed in the bottom surface of the package body, the first downset extending between the inner end portion and the wire bond zone thereof, and the second downset extending between the wire bond zone and the outer end portion thereof;

each of the second leads includes a wire bond zone and an outer end portion, the downset of each of the second leads extending between the wire bond zone and the outer end portion thereof; and the conductive wires extend from the semiconductor die to respective ones of the wire bond zones of the first leads and second leads.

5. The semiconductor package of claim 4 wherein the conductive wires further extend to the outer end portions of certain ones of the second leads which do not include a downset formed therein.

6. The semiconductor package of claim 4 wherein:
the die paddle and the inner end portions of the first leads extend along a first plane;
the wire bond zones of the first and second leads each extend along a second plane which is disposed in spaced, generally parallel relation to the first plane; and
the outer end portions of the first and second leads each extend along a third plane which is disposed in spaced, generally parallel relation to the second plane such that the second plane extends between the first and third planes.

7. The semiconductor package of claim 4 wherein portions of the outer end portions of the second leads protrude from respective ones of the side surfaces of the package body and are bent to assume a gull-wing configuration.

8. A semiconductor package comprising:
a generally planar die paddle defining multiple peripheral edge segments;

a plurality of first leads segregated into at least two sets which extend along respective ones of at least two peripheral edge segments of the die paddle;

a plurality of second leads which each include first and second downsets formed therein in spaced relation to each other, the second leads being segregated into at least two sets which extend along respective ones of at least two peripheral edge segments of the die paddle;

a plurality of third leads, at least some of which include a downset formed therein, the third leads being segregated into at least two sets which extend along respective ones of at least two peripheral edge segments of the die paddle;

a semiconductor die attached to the die paddle and electrically connected to at least one of each of the first, second and third leads; and a package body defining a generally planar bottom surface and multiple side surfaces, the package body at least partially encapsulating the first, second and third leads and the semiconductor die such that the first and second downsets of the second leads and the downsets of the third leads are covered by the package body, at least portions of the die paddle and the first and second leads are exposed in and substantially flush with the bottom surface of the package body, and portions of the third leads protrude from respective ones of the side surfaces of the package body.

9. The semiconductor package of claim 8 wherein at least some of the first leads are integrally connected to the die paddle and define signal pins.

10. The semiconductor package of claim 8 wherein at least some of the first leads are formed to include an enlarged locking tip structure to facilitate the anchoring thereof to the package body.

11. The semiconductor package of claim 8 wherein the die paddle has a generally quadrangular configuration, and the first, second and third leads are segregated into at least four sets which each extend along a respective one of the peripheral edge segments of the die paddle.

12. The semiconductor package of claim 8 wherein the semiconductor die is electrically connected to the first, second and third leads by conductive wires which are covered by the package body.

13. The semiconductor package of claim 12 wherein:
each of the first leads defines a terminal which is exposed in the bottom surface of the package body;
each of the second leads includes an inner end portion, a wire bond zone, and an outer end portion, the inner end portion being disposed between the first downset thereof and the die paddle and defining a terminal which is exposed in the bottom surface of the package body, the first downset extending between the inner end portion and the wire bond zone thereof, and the second downset extending between the wire bond zone and the outer end portion thereof;

each of the third leads includes a wire bond zone and an outer end portion, the downset of each of the third leads extending between the wire bond zone and the outer end portion thereof; and the conductive wires extend from the semiconductor die to respective ones of the first leads and the wire bond zones of the second leads and third leads.

14. The semiconductor package of claim 13 wherein the conductive wires further extend to the outer end portions of certain ones of the third leads which do not include a downset formed therein.

15. The semiconductor package of claim 13 wherein:
the die paddle, the first leads and the inner end portions of the second leads extend along a first plane;
the wire bond zones of the second and third leads each extend along a second plane which is disposed in spaced, generally parallel relation to the first plane; and
the outer end portions of the second and third leads each extend along a third plane which is disposed in spaced, generally parallel relation to the second plane such that the second plane extends between the first and third planes.

16. The semiconductor package of claim 13 wherein portions of the outer end portions of the third leads protrude from respective ones of the side surfaces of the package body and are bent to assume a gull-wing configuration.

17. The semiconductor package of claim 13 wherein the terminal defined by each of the first leads is linearly aligned with the terminal defined by a respective one of the second leads.

18. The semiconductor package of claim 13 wherein the outer end portions of the second leads and at least some of the third leads each include an angled section.

19. A semiconductor package comprising:
a die paddle;
a plurality of first leads extending along the die paddle;
a plurality of second leads which each include first and second downsets formed therein in spaced relation to each other, the second leads extending along the die paddle;
a plurality of third leads, at least some of which include a downset formed therein, the third leads extend along the die paddle;
a semiconductor die attached to the die paddle and electrically connected to at least one of each of the first, second and third leads; and
a package body defining a bottom surface and multiple side surfaces, the package body at least partially encapsulating the first, second and third leads and the semiconductor die such that the first and second downsets of the second leads and the downsets of the third leads are covered by the package body, at least portions of the die paddle and the first and second leads are exposed in the bottom surface of the package body, and portions of the third leads protrude from respective ones of the side surfaces of the package body.

20. The semiconductor package of claim 19 wherein:
each of the first leads defines a terminal which is exposed in the bottom surface of the package body;
each of the second leads includes an inner end portion, a wire bond zone, and an outer end portion, the inner end portion being disposed between the first downset thereof and the die paddle and defining a terminal which is exposed in the bottom surface of the package body, the first downset extending between the inner end portion and the wire bond zone thereof, and the second downset extending between the wire bond zone and the outer end portion thereof;
each of the third leads includes a wire bond zone and an outer end portion, the downset of each of the third leads extending between the wire bond zone and the outer end portion thereof; and
conductive wires extend from the semiconductor die to respective ones of the first leads and the wire bond zones of the second leads and third leads.

* * * * *